US011963456B2

(12) United States Patent
Houssameddine et al.

(10) Patent No.: US 11,963,456 B2
(45) Date of Patent: Apr. 16, 2024

(54) MRAM MEMORY ARRAY YIELD IMPROVEMENT

(71) Applicant: INTERNATIONAL BUSINESS MACHINES CORPORATION, Armonk, NY (US)

(72) Inventors: Dimitri Houssameddine, Sunnyvale, CA (US); Kangguo Cheng, Schenectady, NY (US); Julien Frougier, Albany, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 171 days.

(21) Appl. No.: 17/658,838

(22) Filed: Apr. 12, 2022

(65) Prior Publication Data

US 2023/0329122 A1    Oct. 12, 2023

(51) Int. Cl.
*G11C 11/00* (2006.01)
*G11C 11/16* (2006.01)
*H10B 61/00* (2023.01)
*H10N 50/01* (2023.01)

(52) U.S. Cl.
CPC ........... *H10N 50/01* (2023.02); *G11C 11/161* (2013.01); *G11C 11/1655* (2013.01); *G11C 11/1657* (2013.01); *G11C 11/1659* (2013.01); *H10B 61/22* (2023.02)

(58) Field of Classification Search
CPC ......... G11C 11/16; G11C 11/15; H01L 43/03; H01L 27/228; H01L 43/08
USPC .................................................. 365/158, 171
See application file for complete search history.

(56) References Cited

U.S. PATENT DOCUMENTS

| 7,852,677 | B2 | 12/2010 | Orban |
| 9,378,815 | B2 | 6/2016 | Lee |
| 9,753,657 | B2 | 9/2017 | Yang |
| 10,145,891 | B2 | 12/2018 | Cho |
| 10,553,294 | B2 | 2/2020 | Dunga |
| 10,916,286 | B2 * | 2/2021 | Ying .................. G11C 11/1693 |
| 2018/0137929 | A1 | 5/2018 | Samson |
| 2019/0066820 | A1 * | 2/2019 | Wang .................... H10B 61/20 |
| 2020/0020742 | A1 | 1/2020 | Liu |

FOREIGN PATENT DOCUMENTS

WO    2017048337 A1    3/2017

OTHER PUBLICATIONS

Cai et al., "Addressing Failure and Aging Degradation in MRAM/MeRAM-on-FDSOI Integration", IEEE Transactions on Circuits and Systems—I: Regular Papers, © 2018 IEEE, 13 pages.
(Continued)

*Primary Examiner* — Son T Dinh
(74) *Attorney, Agent, or Firm* — Yuanmin Cai

(57) ABSTRACT

Embodiments of present invention provide a method of improving yield of making MRAM arrays. More specifically, the method includes receiving an MRAM array; identifying a weak MRAM cell from the MRAM array wherein the weak MRAM cell includes an access transistor; and modifying the access transistor. In one embodiment, modifying the access transistor includes performing a hot carrier injection into a gate dielectric layer of the access transistor.

20 Claims, 4 Drawing Sheets

(56) References Cited

OTHER PUBLICATIONS

Cheng et al., "Hot-carrier-induced oxide charge trapping and interface trap creation in metal-oxide-semiconductor devices studied by hydrogen/deuterium isotope effect", AIP, Applied Physics Letters, Appl Phys. Lett. 78, 1882, 2001, 4 pages.

Kamakura et al., "Characteristics of Hot Hole Injection, Trapping, and Detrapping in Gate Oxide of Polycrystalline Silicon Thin-Film Transistors", Published Feb. 20, 2012, Copyright (c) 2012 The Japan Society of Applied Physics, Japanese Journal of Applied Physics, vol. 51, No. 2S, 02BC05, 3 pages.

Robertson, "Band offsets of wide-band-gap oxides and implications for future electronic devices", J. Vac. Sci. Technol. B 18, (3), May/Jun. 2000, pp. 1785-1791.

Saks et al., "Observation of Hot-Hole Injection in NMOS Transistos Using a Modified Floating-Gate Technique", IEEETransactions on Electron Devices, vol. ED-33, No. 10, Oct. 1986, pp. 1529-1534.

* cited by examiner

MRAM MEMORY ARRAY YIELD IMPROVEMENT

BACKGROUND

The present application relates to manufacturing of semiconductor integrated circuits. More particularly, it relates to improvement of magnetoresistive random-access-memory yield.

Magnetoresistive random-access memory (MRAM) is a type of non-volatile memory (NVM) capable of holding saved data even if power to the memory is down or the power is accidentally cut off. There have been several recent developments in the technology that allow MRAM to be used successfully in specific emerging applications, as well as in not-so-new ones.

MRAM technology is based on a component known as magnetic tunnel junction (MTJ) that consists of two ferromagnetic layers separated by an insulating layer. An MRAM cell usually includes an MTJ and an access transistor. An MRAM cell works by causing change in the spin orientations of the two ferromagnetic layers by the access transistor, thereby changing the resistance of the MTJ. In other words, resistance of the MTJ is dependent on the relative spin orientations of the two ferromagnetic layers, and it can adopt two resistance values: high resistance or low resistance representing a logic 1 or a logic 0.

A MRAM device usually comes as an array of MRAM cells. However, an array of MRAM cells inevitably may include some weak MRAM cells that may not function as expected or designed. For example, a weak MRAM cell may be a MRAM cell that does not demonstrate a sufficiently high resistance, when it is expected to, therefor may generate an error. A rate or probability of such occurrence of error is known as bit-error-rate (BER). Bit error rate of an MRAM array is usually limited by worst error rate bits (or cells) in the memory array. Normally, these worst error rate cells need to be replaced by some redundant MRAM cells.

SUMMARY

In order to improve yield and reliability of MRAM arrays, it is advantageous to increase the programming voltage being applied to MRAM cells that are identified as weak MRAM cells. In other words, weak MRAM cells may still be made to function properly under increased operational voltage. Alternatively, weak MRAM cells may be modified or "repaired" to have their access transistor having a lowered threshold voltage to function. According to one embodiment of present invention, lowering threshold voltage of a MRAM cell may be achieved by injecting hot carriers into a gate dielectric of the access transistor of the MRAM cell.

Embodiments of present invention provide a method of improving yield of MRAM device. The method includes receiving a magnetoresistive random-access memory (MRAM) array; identifying a weak MRAM cell from the MRAM array, wherein the weak MRAM cell comprises an access transistor, and modifying the access transistor.

In one embodiment, modifying the access transistor includes performing a hot carrier injection into a gate dielectric layer of the access transistor to lower a threshold voltage of the access transistor. In one aspect, performing the hot carrier injection includes grounding a source line of the weak MRAM cell, biasing a word line of the weak MRAM cell at a voltage above the threshold voltage of the access transistor, and biasing a bit line of the weak MRAM cell at a voltage higher than a normal operational voltage.

According to one embodiment, the access transistor is an n-type transistor having a source connected to the source line; a drain connected to the bit line; and a gate connected to the word line, and wherein performing the hot carrier injection includes causing hot electrons to be accelerated from the source of the access transistor to the drain of the access transistor to generate electron-hole pairs through impact ionization. In one aspect, the weak MRAM cell includes a magnetic tunnel junction (MTJ) connected between the bit line and the drain of the access transistor, and wherein biasing the bit line comprises biasing the drain of the access transistor via the MTJ. For example, in one embodiment, biasing the word line includes applying a voltage about 0.15V above the threshold voltage of the access transistor to the word line and biasing the bit line comprises applying a voltage about 0.4V higher than the normal operational voltage to the bit line.

BRIEF DESCRIPTION OF THE DRAWINGS

The present invention will be understood and appreciated more fully from the following detailed description of embodiments of present invention, taken in conjunction with accompanying drawings of which.

Figure 1:
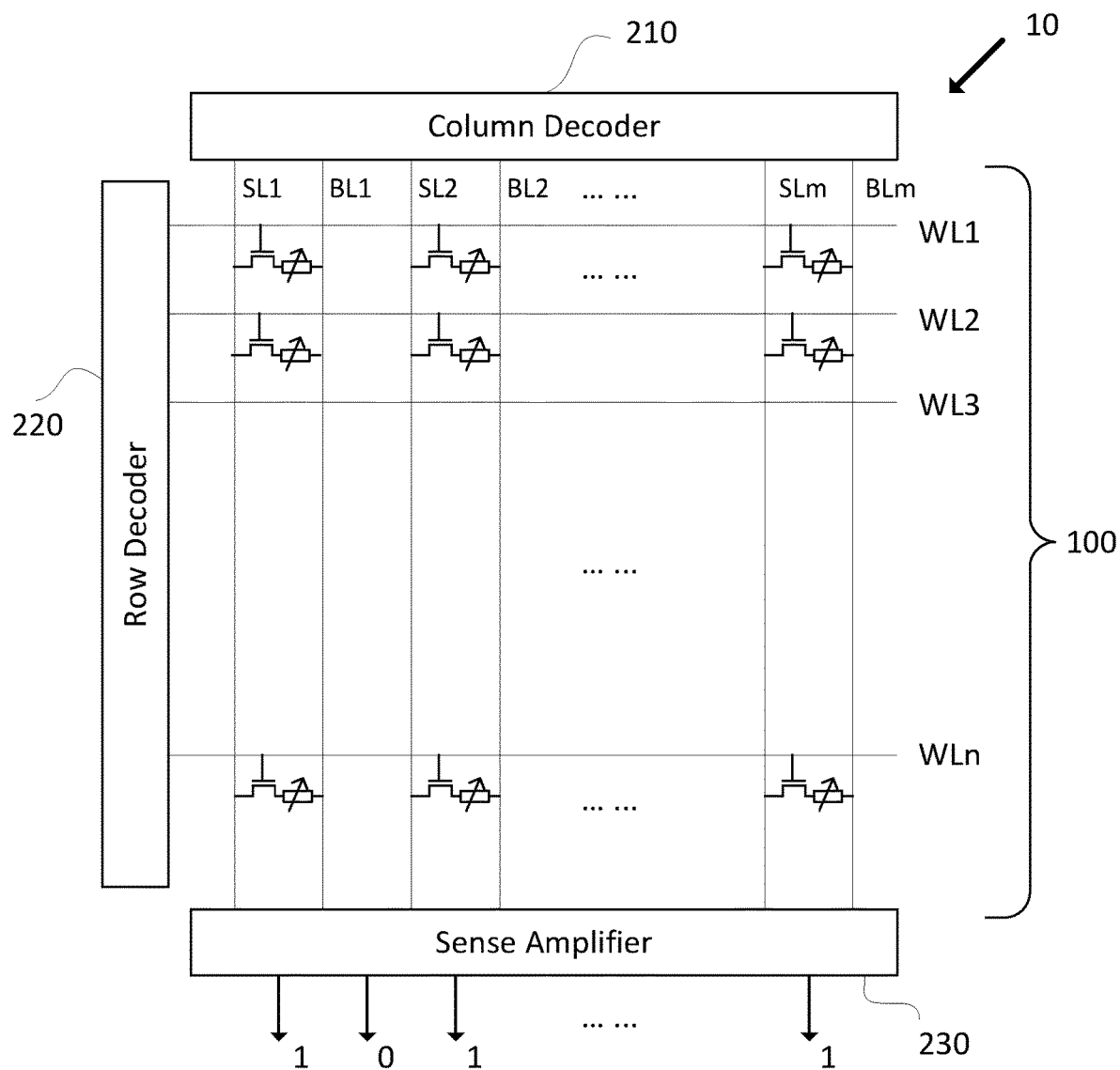
FIG. 1 is a schematic illustration of an MRAM array according to an embodiment of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

Moreover, the same or similar reference numbers are used throughout the drawings to denote the same or similar features, elements, or structures, and thus, a detailed explanation of the same or similar features, elements, or structures may not be repeated for each of the drawings.

FIG. 1 is a schematic illustration of an MRAM array according to an embodiment of present invention. More specifically, FIG. 1 illustrates an MRAM device 10 having an MRAM array 100 of M columns and N rows of individual MRAM cells. In one embodiment, M and/or N may be individually equal to or larger than 5 and the MRAM array 100 may have at least 25 MRAM cells. In another embodiment, M and/or N may be individually equal to or larger than 10 and the MRAM array 100 may include at least 100 MRAM cells.

The MRAM array 100 may be connected to a column decoder 210 and a row decoder 220. More specifically, a source line (SL) and a bit line (BL) of each MRAM cell may be connected to and driven by the column decoder 210, and a word line (WL) of each MRAM cell may be connected to and driven by the row decoder 220. As an output, the MRAM array 100 may provide a set of logic bits such as "1" and "0" through a sense amplifier 230.

Figure 2:
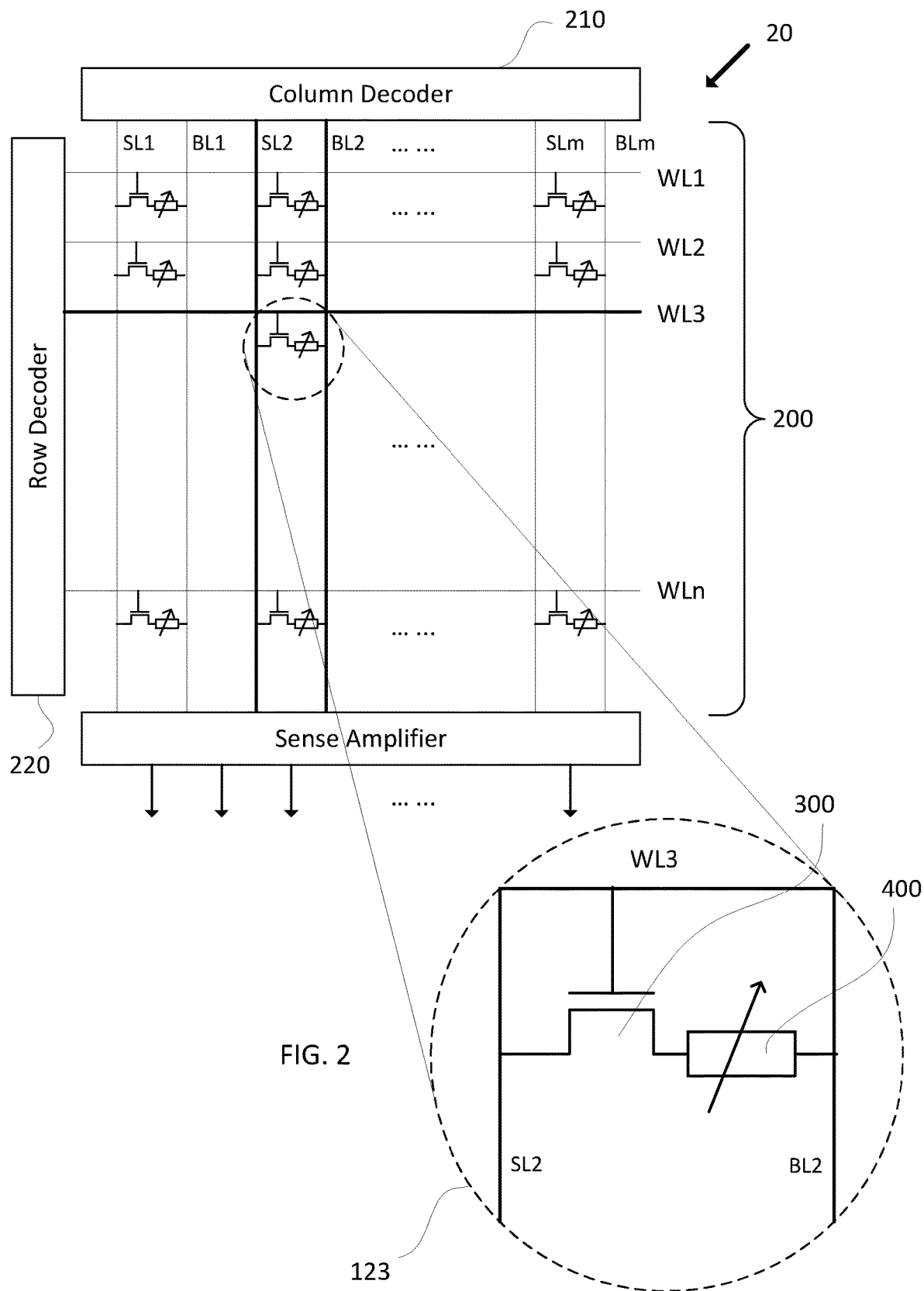
FIG. 2 is a schematic illustration of an MRAM array where a weak MRAM cell is identified according to an embodiment of present invention.

FIG. 2 is a schematic illustration of an MRAM array where a weak MRAM cell is identified according to an embodiment of present invention. More specifically, FIG. 2 illustrates an MRAM device 20 having an MRAM array 200 that includes M columns and N rows of MRAM cells. The M columns and N rows of MRAM cells are driven by column decoder 210 and row decoder 220. Each MRAM cell may include a magnetic tunnel junction (MTJ) connected to an access transistor and may be connected to a word line (WL), a source line (SL), and a bit line (BL). For example, an MRAM cell 123 may include a MTJ 400 connected to an access transistor 300. More particularly, the MTJ 400 may be connected to a drain of the access transistor 300. The MRAM cell 123 may include a word line (WL3) connected to a gate of the access transistor 300, a source line (SL2) connected to a source of the access transistor 300, and a bit line (BL2) connected to the MTJ 400 that in turn connects to the drain of the access transistor 300.

An MTJ, for example the MTJ 400, may include two ferromagnetic plates, each of which may hold a magnetization, separated by a thin insulating layer. One of the two plates is a permanent magnet set to a particular polarity and the other plate's magnetization can be changed to match that of an external field to store memory. During a "read" operation of a MRAM cell, the particular MRAM cell may be selected by powering its access transistor that switches current from a supply line through the cell to ground. Because of tunnel magnetoresistance, electrical resistance of the cell changes with relative orientation of the magnetization in the two ferromagnetic plates of the MTJ. By measuring the resulting current, the resistance inside the cell may be determined and so are the magnetization alignment of the two plates. If the two plates have the same magnetization alignment (low resistance state) this is considered to mean "1", while if the alignment is antiparallel the resistance will be higher (high resistance state) and this means "0". On the other hand, during a "write" or "programming" operation, current passes through the plates to create an induced magnetic field at the junction. The magnetic field may be picked up by the writable plate to change its magnetization alignment resulting in changes in resistance state of the MRAM cell. In some embodiment, spin-aligned electrons may be used to create torque which changes the alignment of the writable plate.

The MRAM array 200 may include M-by-N, for example 5-by-5, 5-by-10, or 10-by-10, individual MRAM cells. Upon fabrication, access transistors of each individual MRAM cells may have a threshold voltage of initial value. If one or more MRAM cells of the MRAM array 200 are identified as weak MRAM cells, according to one embodiment of present invention, these weak MRAM cells are subjected to a modification procedure and threshold voltages of their access transistors are modified. More specifically, threshold voltages of access transistors of these weak MRAM cells are lowered, through a hot carrier injection as being described below in more details. Hereinafter, threshold voltages of the access transistors of the MRAM cells may sometimes be directly referenced to, for short, as threshold voltage of the MRAM cells. These weak MRAM cells then have a threshold voltage of lower values than their initial values. This lowered threshold voltage subsequently becomes the threshold voltage of these weak MRAM cells during normal operation.

According to one embodiment, after being subjected to the modification procedure, the MRAM array 200 of M columns and N rows has at least one MRAM cell whose threshold voltage has been modified or lowered to be lower by about 0.05V than an average of the threshold voltages of the rest of MRAM cells where M and N are individually equal to or larger than 5. In another embodiment, at least two MRAM cells of the MRAM array 200 may each have a threshold voltage that is modified or lowered to be lower by about 0.1V than an average of the threshold voltages of the rest of MRAM cells where M and N are individually equal to or larger than 10.

According to another embodiment, at least one MRAM cell, for example the MRAM cell 123, may be identified as a weak MRAM cell. This weak MRAM cell 123 may be identified by the scanning MRAM array 200 of the MRAM device 20 through the column decoder 210 and the row decoder 220. Embodiments of present invention apply a modification procedure to modify the threshold voltage of an access transistor of the identified weak MRAM cell 123 to help improve the probability of the MRAM cell 123 functioning properly and correctly, reducing bit-error-rate of the MRAM cell 123 and consequently improve usability of the MRAM device 20.

More specifically, one embodiment provides performing a hot carrier injection into a gate dielectric layer of the access transistor 300 to lower the threshold voltage from an initial value to a lowered value. In performing the hot carrier injection, embodiments of present invention provide grounding the source line (SL2) of the weak MRAM cell 123, biasing the word line (WL3) at a voltage above the threshold voltage, and biasing the bit line (BL2) at a voltage higher than the normal operational voltage.

One embodiment of present invention provides applying a bias voltage to the word line that is about 0.15V higher than the threshold voltage of a weak MRAM cell and applying a voltage to the bit line that is about 0.4V higher than the normal operational voltage of the weak MRAM cell. For example, the weak MRAM cell 123 may have a threshold voltage (of initial value) of about 0.25V at the word line and a normal operational voltage of about 0.8V at the bit line. Embodiment of present invention includes applying a bias voltage of about 0.4V to the word line, that is, about 0.15V higher than the 0.25V threshold voltage (of initial value), and about 1.2V to the bit line, that is, about 0.4V higher than the 0.8V normal operational voltage of the weak MRAM cell 123. In one embodiment, the 1.2V bias voltage applied to the bit line may be applied for a duration of at least 1 second, or whatever appropriate time, to cause proper amount of hot carrier injection happening to the gate dielectric of the access transistor 300, thereby resulting in sufficient lowering of the threshold voltage.

In one embodiment, the bias voltage applied to the bit line (BL2) may be applied to the drain of the access transistor 300 via the MTJ 400 since the MTJ 400 is connected to the drain of the access transistor 300. In yet another embodiment, the word line (WL3) is biased through the row decoder 220 and the voltage applied to the bit line (BL2) is provided through the column decoder 210.

Figure 3:
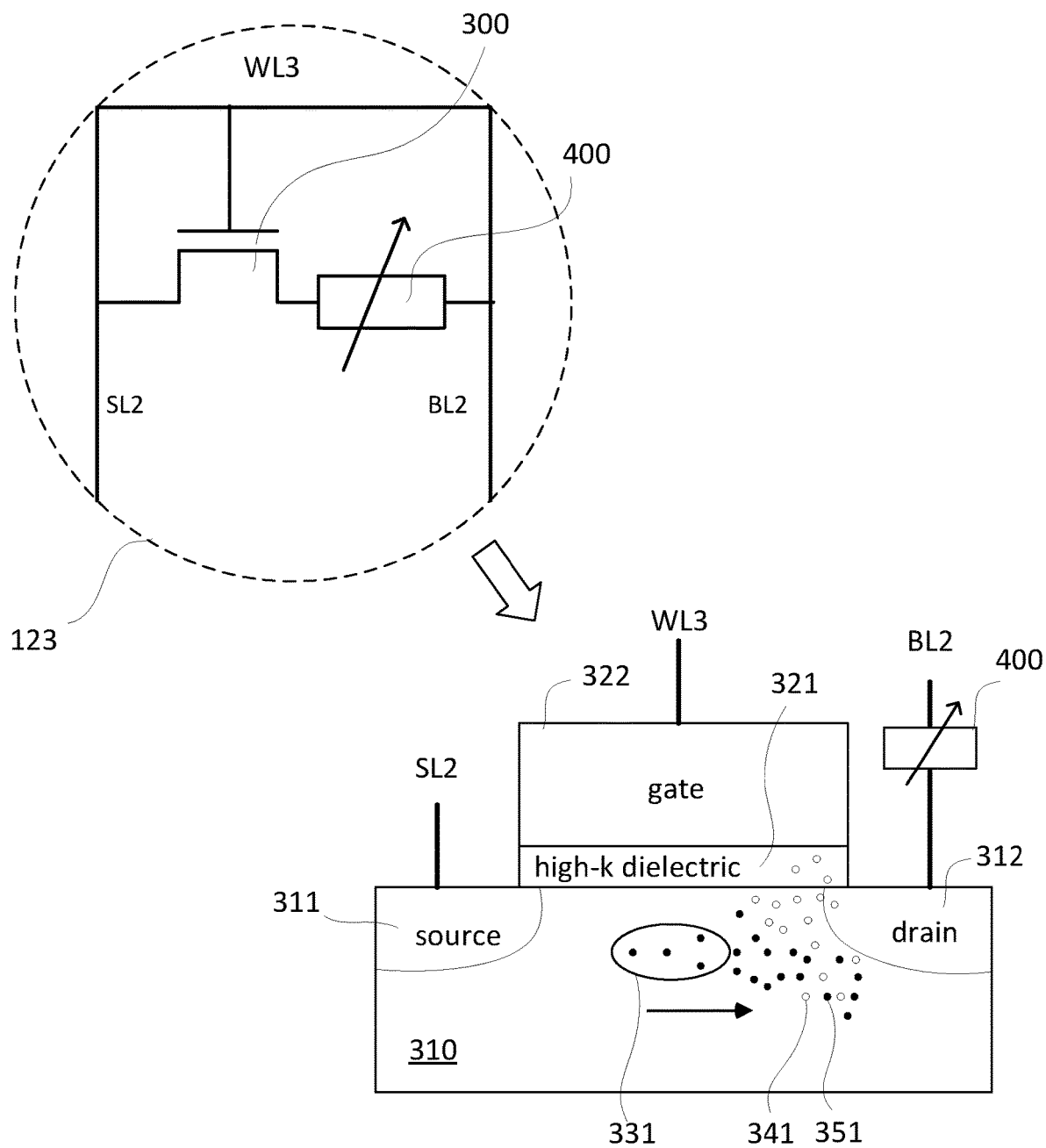
FIG. 3 is a schematic illustration of a weak MRAM cell being repaired through hot carrier injection according to an embodiment of present invention.

FIG. 3 is a schematic illustration of a weak MRAM cell under modification through hot carrier injection according to an embodiment of present invention. For example, assuming the weak MRAM cell 123 includes an n-type transistor whose source 311 is connected to a source line SL2, whose gate 322 is connected to a word line WL3, and whose drain 312 is connected to a bit line BL2 via the MTJ 400. Embodiments of present invention provide performing hot carrier injection by causing electrons, such as electrons 331, to accelerate from a source 311 to a drain 312 of the access transistor 300 to become hot electrons 331 and using the hot electrons 331 to generate electron-hole pairs 341 and 351 through impact ionization. The generated holes may be injected into a gate dielectric layer 321 of the gate 322 because of favorite electric field, such as lower gate voltage and higher drain voltage, resulting in lowered threshold voltage of the access transistor 300.

In one embodiment, there is an average threshold voltage of the threshold voltages of each individual MRAM cells within the MRAM array and the average threshold voltage may be a nominal threshold voltage. The lowered threshold voltage of a weak MRAM cell, such as the MRAM cell 123, may be lower than the nominal threshold voltage by at least 0.05V. For example, the lowered threshold voltage may be lower than the nominal threshold voltage by about 0.1V. After modifying the weak MRAM cell 123, for example, embodiment of present invention may continue to identify other weak MRAM cell or cells and perform threshold voltage modification of these weak MRAM cells until the number of weak MRAM cells being modified is deemed to be sufficient for the yield improvement of the MRAM array.

Figure 4:
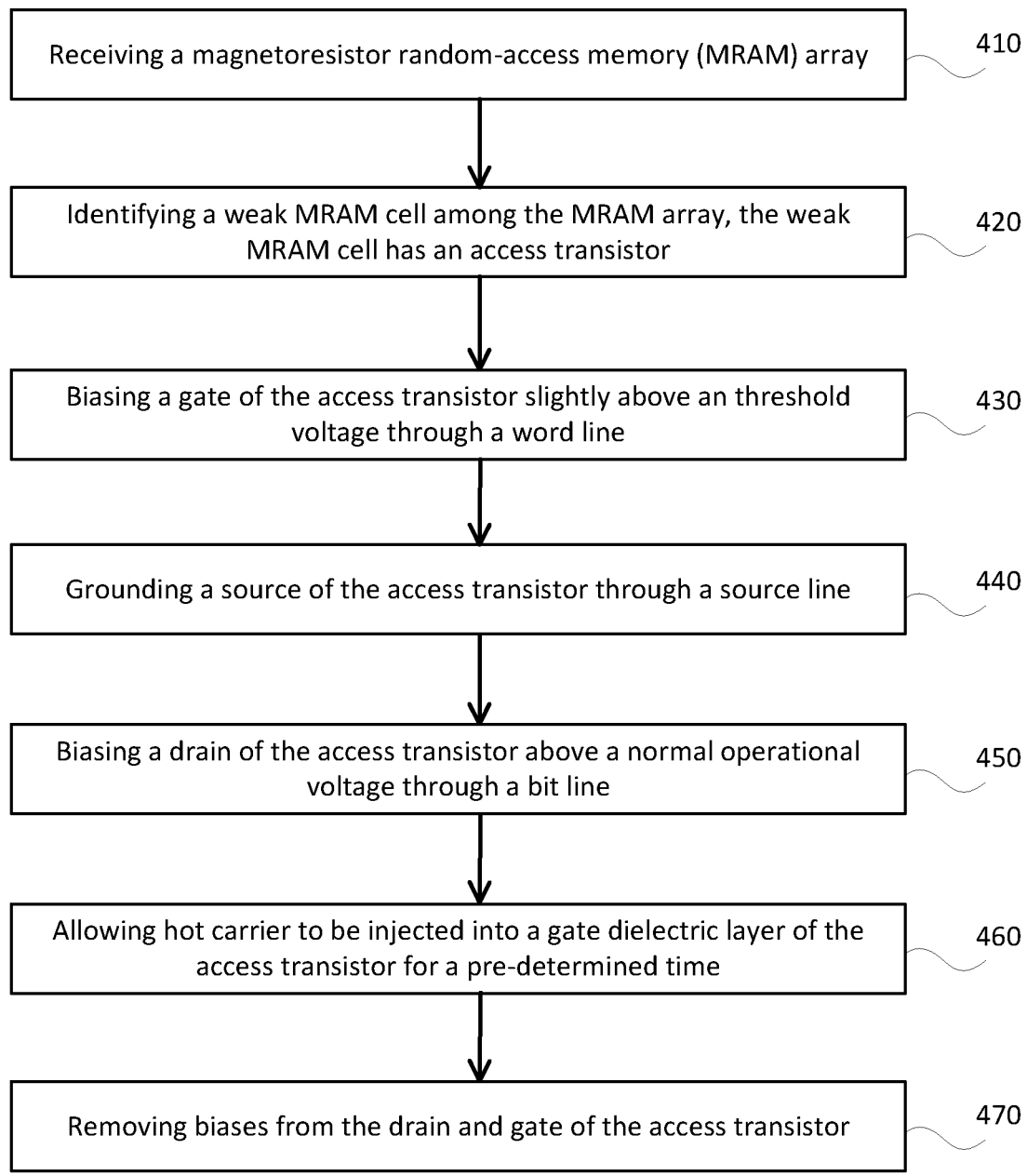
FIG. 4 is a demonstrative illustration of a flow-chart of a method of performing hot carrier injection in MRAM array according to embodiments of present invention.

FIG. 4 is a demonstrative illustration of a flow-chart of a method of improving yield of manufacturing MRAM device according to embodiments of present invention. More specifically, embodiment of present invention provides (410) receiving a MRAM array; and (420) identifying at least one weak MRAM cell among the plurality MRAM cells of the MRAM array with each MRAM cell having an access transistor. Embodiments of present invention then proceed to modify a threshold voltage of the weak MRAM cell by (430) biasing a gate of the access transistor slightly above the threshold voltage through a word line; (440) grounding a source of the access transistor through a source line; and (450) biasing a drain of the access transistor above a normal operational voltage through a bit line. Embodiments of present invention then (460) allowing hot carrier to be generated and injected into a gate dielectric layer of the access transistor for a pre-determined time or duration, for example, of at least 1 second up to about 10 seconds. After the hot carrier injection, embodiment of present invention includes (470) removing biases to the drain and gate of the access transistor, and the threshold voltage of the access transistor is modified or lowered to have a lower value than an average value of threshold voltage of rest of the plurality of MRAM cells in the MRAM array.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions of various embodiments of present invention have been presented for the purposes of illustration and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A method comprising:
   receiving a magnetoresistive random-access memory (MRAM) array;
   identifying a weak MRAM cell from the MRAM array, wherein the weak MRAM cell comprises an access transistor, and
   modifying the access transistor.

2. The method of claim 1, wherein modifying the access transistor comprises performing a hot carrier injection into a gate dielectric layer of the access transistor to lower a threshold voltage of the access transistor.

3. The method of claim 2, wherein performing the hot carrier injection comprises grounding a source line of the weak MRAM cell, biasing a word line of the weak MRAM cell at a voltage above the threshold voltage of the access transistor, and biasing a bit line of the weak MRAM cell at a voltage higher than a normal operational voltage.

4. The method of claim 3, wherein the access transistor is an n-type transistor having a source connected to the source line; a drain connected to the bit line; and a gate connected to the word line, and wherein performing the hot carrier injection comprises causing hot electrons to be accelerated from the source of the access transistor to the drain of the access transistor to generate electron-hole pairs through impact ionization.

5. The method of claim 4, wherein the weak MRAM cell comprises a magnetic tunnel junction (MTJ) connected between the bit line and the drain of the access transistor, and wherein biasing the bit line comprises biasing the drain of the access transistor via the MTJ.

6. The method of claim 3, wherein biasing the word line comprises applying a voltage about 0.15V above the threshold voltage of the access transistor to the word line and biasing the bit line comprises applying a voltage about 0.4V higher than the normal operational voltage to the bit line.

7. The method of claim 3, wherein the word line is biased through a row decoder, and the bit line is biased through a column decoder.

8. The method of claim 1, wherein the weak MRAM cell is a first weak MRAM cell of the MRAM array, further comprising:
   identifying a second weak MRAM cell from the MRAM array; and
   modifying the second weak MRAM cell.

9. The method of claim 8, wherein modifying the second weak MRAM cell comprises lowering a threshold voltage of an access transistor of the second weak MRAM cell by a hot-carrier injection to a gate dielectric layer of the access transistor of the second weak MRAM cell.

10. A method comprising:
    receiving a magnetoresistive random-access memory (MRAM) device;
    identifying at least one weak MRAM cell from the MRAM device, wherein the at least one weak MRAM cell comprises an access transistor and a magnetic tunnel junction (MTJ) connected to a drain of the access transistor; a word line connected to a gate of the access transistor; a source line connected to a source of the access transistor; and a bit line connected to the drain of the access transistor via the MTJ, and
    modifying the access transistor.

11. The method of claim 10, wherein modifying the access transistor comprises performing a hot carrier injection into a gate dielectric layer of the access transistor to lower a threshold voltage of the access transistor.

12. The method of claim 11, wherein performing the hot carrier injection comprises grounding the source line of the at least one weak MRAM cell, biasing the word line above the threshold voltage of the access transistor, and applying a voltage higher than a normal operational voltage to the bit line for a duration of at least 1 second.

13. The method of claim 12, wherein performing the hot carrier injection comprises accelerating hot electrons from the source of the access transistor to the drain of the access transistor to cause generation of electron-hole pairs through impact ionization.

14. The method of claim 12, wherein applying the voltage higher than the normal operational voltage to the bit line comprises applying the voltage higher than the normal operational voltage to the drain of the access transistor via the MTJ.

15. The method of claim 12, wherein biasing the word line comprises applying a voltage about 0.15V higher than the threshold voltage of the access transistor to the word line, and wherein applying a voltage to the bit line comprises applying a voltage about 0.4V higher than the normal operational voltage to the bit line.

16. The method of claim 12, wherein the word line is biased through a row decoder, and the voltage applied to the bit line is provided through a column decoder.

17. The method of claim 16, wherein identifying the at least one weak MRAM cell comprises scanning an MRAM array of the MRAM device through the row decoder and the column decoder.

18. The method of claim 11, wherein the MRAM device comprises an array of MRAM cells of M columns and N rows, wherein M and N are individually equal to or larger than 5, each MRAM cell includes an access transistor having a threshold voltage, and wherein the threshold voltage of the access transistor of the at least one weak MRAM cell is lowered by at least 0.05V than an average of the threshold voltage of rest of the MRAM cells.

19. A magnetoresistive random-access memory (MRAM) device comprising:
    an array of MRAM cells of M columns and N rows wherein M and N are individually equal to or larger than 5; each MRAM cell includes an access transistor that has a threshold voltage,
    wherein at least one of the MRAM cells has a threshold voltage that is lower by about 0.05V than an average of the threshold voltage of rest of the MRAM cells.

20. The MRAM device of claim 19, wherein the M and the N are individually equal to or larger than 10, and wherein at least two of the MRAM cells each has a threshold voltage that is lower by about 0.1V than the average of the threshold voltage of rest of the MRAM cells.

* * * * *